US011617286B2

United States Patent
Chen et al.

(10) Patent No.: US 11,617,286 B2
(45) Date of Patent: Mar. 28, 2023

(54) HEAT DISSIPATION MODULE, DISPLAY ASSEMBLY AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qizhong Chen, Beijing (CN); Bing Ji, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 246 days.

(21) Appl. No.: 17/274,818

(22) PCT Filed: Jun. 5, 2020

(86) PCT No.: PCT/CN2020/094744
§ 371 (c)(1),
(2) Date: Mar. 10, 2021

(87) PCT Pub. No.: WO2021/243718
PCT Pub. Date: Dec. 9, 2021

(65) Prior Publication Data
US 2022/0201905 A1    Jun. 23, 2022

(51) Int. Cl.
*H05K 7/20* (2006.01)
*H01L 51/52* (2006.01)
(Continued)

(52) U.S. Cl.
CPC ....... *H05K 7/20963* (2013.01); *H01L 51/529* (2013.01); *G06V 40/1318* (2022.01); *H01L 27/3234* (2013.01); *H01L 27/3272* (2013.01)

(58) Field of Classification Search
CPC .............. H05K 7/20963; H01L 51/529; G06V 40/1318
See application file for complete search history.

(56) References Cited

U.S. PATENT DOCUMENTS

2019/0303640 A1* 10/2019 Song ................... G06V 40/1312
2020/0134278 A1   4/2020 Lee et al.
(Continued)

FOREIGN PATENT DOCUMENTS

CN       107102461 A     8/2017
CN       206541104 U    10/2017
(Continued)

*Primary Examiner* — Mukundbhai G Patel
(74) *Attorney, Agent, or Firm* — ArentFox Schiff LLP; Michael Fainberg (57) ABSTRACT

A heat dissipation module includes: a heat dissipation base material layer, provided with a first accommodating slot for accommodating a fingerprint sensor and a second accommodating slot for accommodating a flexible printed circuit, the fingerprint sensor being electrically connected to the flexible printed circuit, the first accommodating slot penetrating through the heat dissipation base material layer; and a light shielding buffer layer, on a side of the heat dissipation base material layer away from an opening of the second accommodating slot and provided with a hollowed-out area, an orthographic projection of the hollowed-out area on the heat dissipation base material layer being in the first accommodating slot, the hollowed-out area being configured to expose a photosensitive area of the fingerprint sensor, and the impedance of a surface of a side of the light shielding buffer layer away from the heat dissipation base material layer being $10^6 \Omega$-$10^{10} \Omega$.

20 Claims, 6 Drawing Sheets

(51) Int. Cl.
    *G06V 40/13*     (2022.01)
    *H01L 27/32*     (2006.01)

(56) References Cited

U.S. PATENT DOCUMENTS

| | | |
|---|---|---|
| 2020/0174613 A1 | 6/2020 | Sun et al. |
| 2020/0218873 A1 | 7/2020 | Guo |
| 2021/0210568 A1* | 7/2021 | Huang ................ H01L 27/3244 |

FOREIGN PATENT DOCUMENTS

| | | |
|---|---|---|
| CN | 207976669 U | 10/2018 |
| CN | 109284716 A | 1/2019 |
| CN | 109791611 A | 5/2019 |
| CN | 111104843 A | 5/2020 |
| KR | 20190063029 A | 6/2019 |

\* cited by examiner

HEAT DISSIPATION MODULE, DISPLAY ASSEMBLY AND DISPLAY DEVICE

CROSS REFERENCE TO RELATED APPLICATIONS

This application is a national phase entry under 35 U.S.C. § 371 of International Application No. PCT/CN2020/094744, filed on Jun. 5, 2020, the entire content of which is incorporated herein by reference.

FIELD

This application relates to the field of display technology, in particular to a heat dissipation module, a display assembly and a display device.

BACKGROUND

As display components of electronic equipment, OLED display devices have been widely used in various electronic products, and an OLED display panel is an important component of a display device. At present, in order to realize an under-screen fingerprint function, a fingerprint module is arranged on the back of a heat dissipation module (SCF, Super Clean Foam), and a fingerprint module hole is formed in the SCF, so that the fingerprint module can collect fingerprint information through the fingerprint module hole of the SCF. In this design, a sensor and a flexible printed circuit (FPC) of the fingerprint module will occupy the space of the complete machine, increase the thickness of the complete machine, and increase the difficulty of assembling.

SUMMARY

This application discloses a heat dissipation module, a display assembly and a display device, with an objective of improving the structure of the heat dissipation module and reducing the thickness of a complete machine.

In order to achieve the above objective, this application provides the following technical solutions.

A heat dissipation module includes:

a heat dissipation base material layer, provided with a first accommodating slot for accommodating a fingerprint sensor and a second accommodating slot for accommodating a flexible printed circuit, the fingerprint sensor and the flexible printed circuit being electrically connected, and the first accommodating slot being an open slot penetrating through the heat dissipation base material layer; and a light shielding buffer layer, located on a side of the heat dissipation base material layer facing away from an opening of the second accommodating slot and provided with a hollowed-out area, an orthographic projection of the hollowed-out area on the heat dissipation base material layer being located in the first accommodating slot, the hollowed-out area being configured to expose a photosensitive area of the fingerprint sensor, and the impedance of a surface of a side of the light shielding buffer layer away from the heat dissipation base material layer being $10^6 \Omega$-$10^{10} \Omega$.

Optionally, the flexible printed circuit is configured to carry components used for realizing a fingerprint identification function.

Optionally, the second accommodating slot is an open slot penetrating through the heat dissipation base material layer.

Optionally, the flexible printed circuit is provided with a component area; at least a part of the flexible printed circuit is located in the second accommodating slot; and the at least part includes the component area.

Optionally, the fingerprint sensor is square, and the flexible printed circuit is strip-shaped, and one end of the flexible printed circuit is connected to the fingerprint sensor.

The first accommodating slot is a square slot similar to the fingerprint sensor in shape; the second accommodating slot is a strip-shaped slot similar to the flexible printed circuit in shape, and one end of the second accommodating slot communicates with the first accommodating slot.

Optionally, the distance between an edge of the fingerprint sensor and an edge of the first accommodating slot is 0.5 mm to 0.7 mm, and the distance between an edge of the flexible printed circuit and an edge of the second accommodating slot is 0.5 mm to 0.7 mm.

Optionally, the hollowed-out area is square, and included angles are formed between all sides of the hollowed-out area and all sides of the square slot.

Optionally, the included angles are greater than 0 and less than 90 degrees.

Optionally, the light shielding buffer layer includes a grid adhesive layer and a foam layer, and the grid adhesive layer is located on a side of the foam layer facing away from the heat dissipation base material layer.

Optionally, the heat dissipation base material layer includes an adhesive layer, a polyimide film layer and a metal film layer; the adhesive layer is located on a side of the polyimide film layer facing the light shielding buffer layer; and the metal film layer is located on a side of the polyimide film layer facing away from the light shielding buffer layer.

Optionally, a material of the metal film layer is copper.

Optionally, a thickness of the grid adhesive layer is 0.035 mm to 0.045 mm; a thickness of the foam layer is 0.09 mm to 0.11 mm; a thickness of the polyimide film layer is 0.02 mm to 0.03 mm; and a thickness of the metal film layer is 0.045 mm to 0.055 mm.

Optionally, depths of the first accommodating slot and the second accommodating slot are greater than or equal to 0.1 mm.

A display assembly includes a display module, and the heat dissipation module described in any one of the above-mentioned embodiments.

The display module is provided with a display area, and the display area is internally provided with a fingerprint identification area.

The heat dissipation module is located on a non-display side of the display module; and an orthographic projection of the hollowed-out area of the light shielding buffer layer on the display module and the fingerprint identification area at least partially overlap.

Optionally, the fingerprint identification area is located within the orthographic projection of the hollowed-out area of the light shielding buffer layer on the display module.

Optionally, the display assembly further includes:

a fingerprint sensor, located in the first accommodating slot of the heat dissipation base material layer, the fingerprint sensor covering the hollowed-out area of the light shielding buffer layer, and an edge of the fingerprint sensor being adhered to the light shielding buffer layer; and a flexible printed circuit, electrically connected to the fingerprint sensor, the flexible printed circuit being located in the second accommodating slot of the heat dissipation base material layer and adhered to the light shielding buffer layer.

Optionally, a distance is reserved between the fingerprint sensor and the edge of the first accommodating slot, and a distance is reserved between the flexible printed circuit and the edge of the second accommodating slot.

Optionally, a surface of a side of the fingerprint sensor facing away from the light shielding buffer layer is closer to the light shielding buffer layer relative to a surface of a side of the heat dissipation base material layer facing away from the light shielding buffer layer, or the surface of the side of the fingerprint sensor facing away from the light shielding buffer layer and the surface of the side of the heat dissipation base material layer facing away from the light shielding buffer layer are approximately flush with each other.

A surface of a side of the flexible printed circuit facing away from the light shielding buffer layer is closer to the light shielding buffer layer relative to the surface of the side of the heat dissipation base material layer facing away from the light shielding buffer layer, or the surface of the side of the flexible printed circuit facing away from the light shielding buffer layer and the surface of the side of the heat dissipation base material layer facing away from the light shielding buffer layer are approximately flush with each other.

Optionally, the fingerprint identification area of the display module has optical paths allowing light to pass through.

A display device, including the display assembly described in any one of the above-mentioned embodiments.

DETAILED DESCRIPTION OF THE EMBODIMENTS

The technical solutions in embodiments of the application will be described clearly and completely below in conjunction with the drawings in the embodiments of the application. Obviously, embodiments described herein are only part of the embodiments of the application, not all the embodiments. Based on the embodiments in the application, all other embodiments obtained by those of ordinary skill in the art without creative work shall fall within the protection scope of the application.

As shown in FIG. 1 to FIG. 4, embodiments of the application provide a heat dissipation module 1. The heat dissipation module 1 includes a heat dissipation base material layer 10 and a light shielding buffer layer 20.

The heat dissipation base material layer 10 is provided with a first accommodating slot 101 used for accommodating a fingerprint sensor 31 and a second accommodating slot 102 used for accommodating a flexible printed circuit 32.

The fingerprint sensor 31 and the flexible printed circuit (FPC) 32 are electrically connected, and the first accommodating slot 101 is an open slot penetrating through the heat dissipation base material layer 10.

The light shielding buffer layer 20 is on a side of the heat dissipation base material layer 10 facing away from an opening of the second accommodating slot 102 and is provided with a hollowed-out area 200. An orthographic projection of the hollowed-out area 200 on the heat dissipation base material layer 10 is in the first accommodating slot 101. The hollowed-out area 200 is configured to expose a photosensitive area of the fingerprint sensor 31. The impedance of a surface of a side of the light shielding buffer layer 20 away from the heat dissipation base material layer 10 is $10^6\Omega$-$10^{10}\Omega$.

Figure 3:
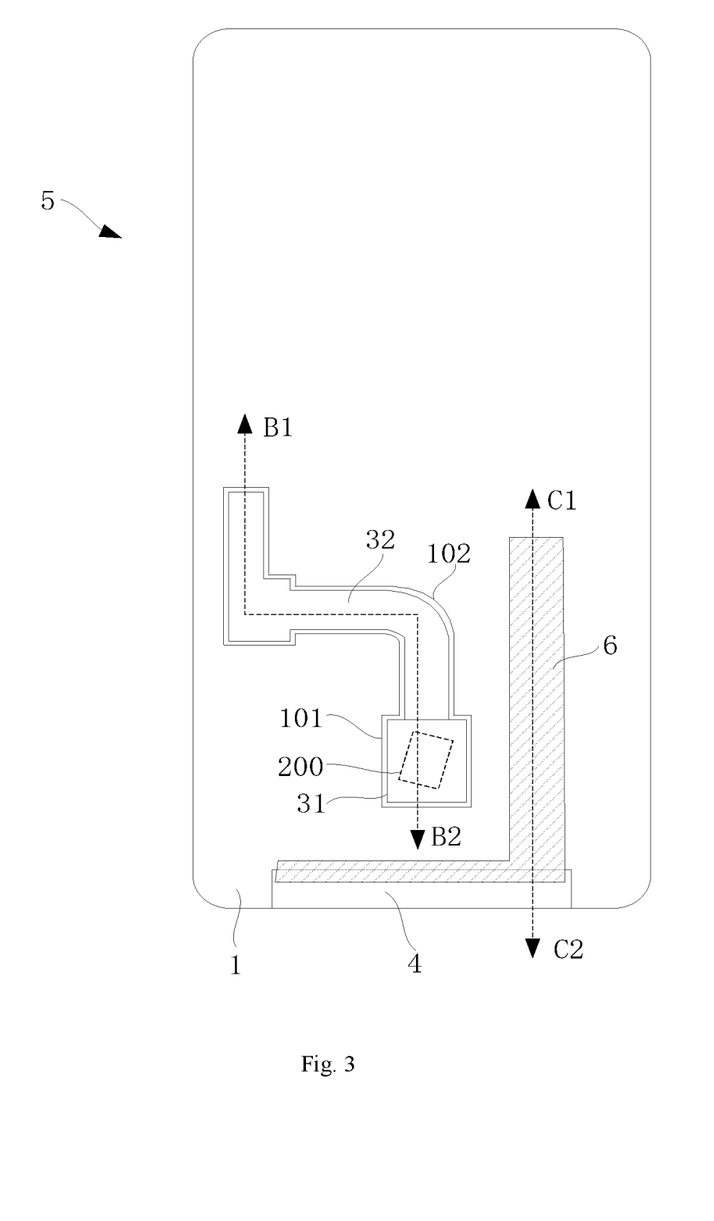
FIG. 3 is a structural schematic diagram of a display assembly provided by an embodiment of the present application.
Figure 4:
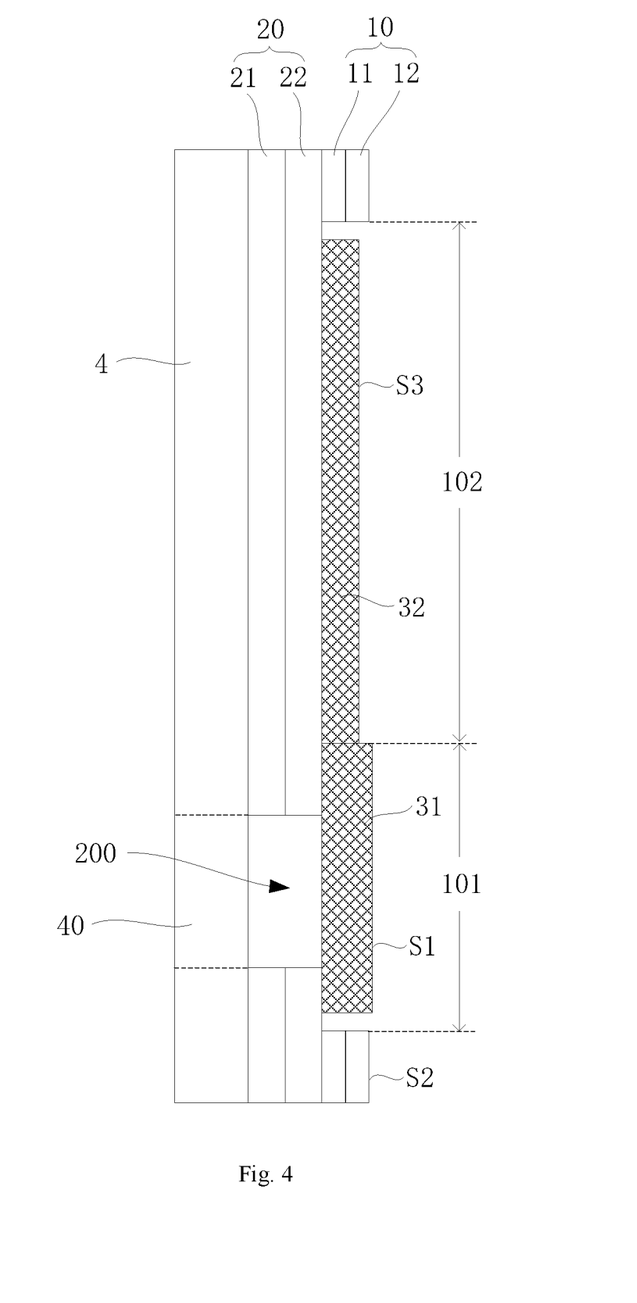
FIG. 4 is a structural schematic diagram of a cross section along a direction B1-B2 of the display assembly in FIG. 3.

The heat dissipation module 1 provided by embodiments of the application includes the heat dissipation base material layer 10 and the light shielding buffer layer 20. In a display device, as shown in FIG. 3 and FIG. 4, the light shielding buffer layer 20 is attached to a back side (a side facing away from a display surface) of a display module 4 to achieve light shielding and buffer effects, and the impedance of a surface of a side of the light shielding buffer layer 20 close to the display module 4 is $10^6\Omega$-$10^{10}\Omega$, thereby achieving a better anti-static effect. The heat dissipation base material layer 10 is on a side of the light shielding buffer layer 20 facing away from the display module 4 to achieve a heat dissipation effect. In the heat dissipation module 1 provided by embodiments of the application, the heat dissipation base material layer 10 is provided with the first accommodating slot 101 and the second accommodating slot 102 to accommodate the fingerprint sensor 31 and the flexible printed circuit 32 respectively. Therefore, the fingerprint module cannot occupy the space of the complete machine of the display product or occupies a very small space, thus effectively reducing the thickness of the complete machine and lowering the difficulty of assembling of the complete machine. Furthermore, since the first accommodating slot 101 and the second accommodating slot 102 play roles in positioning and limiting, the fingerprint sensor 31 and the flexible printed circuit 32 can be assembled more easily, and the difficulty of assembling of the fingerprint module is lowered. In addition, the first accommodating slot 101 is an open slot penetrating through the heat dissipation base material layer 10, and a position of the light shielding buffer layer 20 corresponding to the first accommodating slot 101 is provided with a hollowed-out area 200, thus light entering from a side of an OLED display module 4 can pass through the hollowed-out area 200 of the light shielding buffer layer 20 and reach the photosensitive area of the fingerprint sensor 31 to realize identification of fingerprint information.

In conclusion, the heat dissipation module 1 provided by embodiments of the application can accommodate the fingerprint module, thereby reducing the thickness of the complete machine and lowering the difficulty of assembling of the complete machine.

In some embodiments, the flexible printed circuit 32 is configured to carry components used for realizing a fingerprint identification function, and can realize the fingerprint identification function. That is, the flexible printed circuit 32 is provided with a fingerprint identification circuit used for fingerprint identification. In some embodiments, the flexible printed circuit 32 may also be used for circuit connection only. For example, the flexible printed circuit 32 is used for circuit connection between the fingerprint sensor 31 and a mainboard of the complete machine.

Figure 2:
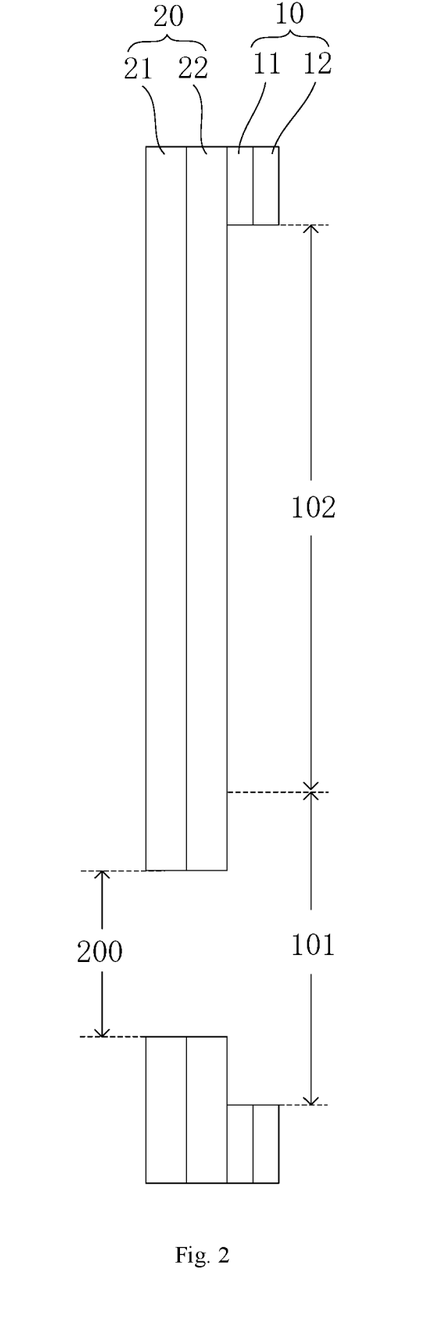
FIG. 2 is a structural schematic diagram of a cross section along a direction A1-A2 of the heat dissipation module in FIG. 1.

As shown in FIG. 2 and FIG. 4, in some embodiments, the second accommodating slot 102 is an open slot penetrating through the heat dissipation base material layer 10.

In some embodiments, the flexible printed circuit (FPC) 32 has a relatively small thickness. The second accommodating slot 102 is set as the open slot, and has a relatively large depth, so that the flexible printed circuit 32 can be completely accommodated in the second accommodating slot 102 to avoid the situation that the flexible printed circuit 32 protrudes from the second accommodating slot 102, thereby reducing the thickness of the complete machine as much as possible and lowering the difficulty of assembling of the complete machine. In some embodiments, the thickness of the flexible printed circuit (FPC) 32 is 0.09 to 1.11 mm, and the depth of the second accommodating slot 102 is greater than or equal to 0.1 mm. Optionally, the depth of the second accommodating slot 102 is greater than or equal to 0.15 mm.

In some embodiments, at least a part of the flexible printed circuit 32 is in the second accommodating slot 102. That is, the flexible printed circuit 32 may be wholly accommodated in the second accommodating slot 102, and may also be partially accommodated in the second accommodating slot 102. Exemplarily, the flexible printed circuit 32 is provided with a component area (such as an area for arranging a resistor, a capacitor and other components), and the part of the flexible printed circuit 32 in the second accommodating slot 102 includes the component area. For example, the component area of the flexible printed circuit 32 is in the second accommodating slot 102, and the rest parts of the flexible printed circuit 32 are outside the second accommodating slot 102.

Exemplarily, the depth of the first accommodating slot 101 is greater than or equal to 0.1 mm. Optionally, the depth of the first accommodating slot 101 is greater than or equal to 0.15 mm.

As shown in FIG. 3, in some embodiments, the fingerprint sensor 31 is square, the flexible printed circuit 32 is strip-shaped, and one end of the flexible printed circuit 32 is connected to the fingerprint sensor 31.

As shown in FIG. 3, exemplarily, the first accommodating slot 101 is a square slot similar to the fingerprint sensor 31 in shape. The second accommodating slot 102 is a strip-shaped slot similar to the flexible printed circuit 32 in shape. One end of the second accommodating slot 102 communicates with the first accommodating slot 101.

In some embodiments, the size of the first accommodating slot 101 may be slightly greater than that of the fingerprint sensor 31. When accommodated in the first accommodating slot 101, the fingerprint sensor 31 may have a distance from an edge of the first accommodating slot 101, thus facilitating the assembling of the fingerprint sensor 31. Similarly, the size of the second accommodating slot 102 is also slightly greater than that of the flexible printed circuit 32, and the specific size and distance may be determined according to sizes and tolerances during actual design. For example, the distance between the edge of the fingerprint sensor 31 and the edge of the first accommodating slot 101 may be 0.5 mm to 0.7 mm. Similarly, the distance between an edge of the flexible printed circuit 32 and the edge of the second accommodating slot 102 may also be 0.5 mm to 0.7 mm. In addition, since the first accommodating slot 101 and the second accommodating slot 102 are designed respectively according to the shapes and the sizes of the fingerprint sensor 31 and the flexible printed circuit 32, and have relatively small sizes as long as they can accommodate the fingerprint sensor 31 and the flexible printed circuit 32, it can be ensured that the heat dissipation base material layer 10 has enough heat dissipation area to avoid the influence generated on the heat dissipation effect of the heat dissipation module 1.

In some embodiments, the setting position of the first accommodating slot 101 may be determined according to the fingerprint identification area set on the display module 4. For example, as shown in FIG. 4, the first accommodating slot 101 and the hollowed-out area 200 in the heat dissipation module 1 need to overlap with the fingerprint identification area 40 of the display module 4.

In some embodiments, the setting position and extending direction of the second accommodating slot 102 are determined according to a setting requirement of the flexible printed circuit 32. One end of the flexible printed circuit 32 is connected to the fingerprint sensor 31, and the other end of the flexible printed circuit 32 is used for being connected to a circuit board. For example, for a display product such as a smart phone, the other end of the flexible printed circuit 32 may be connected to the mainboard of the complete machine.

In some embodiments, as shown in FIG. 3, the fingerprint identification area of the display module 4 is generally close to a lower bezel of the complete machine, so the fingerprint sensor 31 and the flexible printed circuit 32 are relatively close to the lower bezel. A binding portion at the lower part of the display module 4 generally bends towards the back of the heat dissipation module 1, and is bound to a main flexible printed circuit (FPC) 6. In the application, as shown in FIG. 3, the flexible printed circuit 32 is set to have a strip-shaped contour and extend in a bending manner towards a left bezel of the complete machine to avoid the main flexible printed circuit 6 so as not to overlap with the main flexible printed circuit 6.

In some embodiments, as shown in FIG. 3 and FIG. 4, the heat dissipation module 1 and the display module 4 form a display assembly 5 after being assembled. The display assembly 5 is assembled with a middle frame, a polarizer, a touch assembly, a protection cover plate and other structures to complete the assembling of the complete machine. In some embodiments, the middle frame of the complete machine is arranged at the sides of the heat dissipation module 1 and the fingerprint module facing away from the display module 4. The mainboard is arranged on a side of the middle frame facing away from the heat dissipation module 1 and the fingerprint module. An end of the flexible printed circuit 32 away from the fingerprint sensor 31 may be provided with a connector. The middle frame is provided with a hollowed-out portion at the position of the connector. The mainboard is electrically connected to the connector of the flexible printed circuit 32 by means of the hollowed-out portion of the middle frame, thereby realizing signal connection between the fingerprint module and the mainboard. In some embodiments, the flexible printed circuit 32 has an arc-shaped corner and a right-angled corner. The right-angled corner has a relatively large radial size, and may be used for arranging components.

Figure 1:
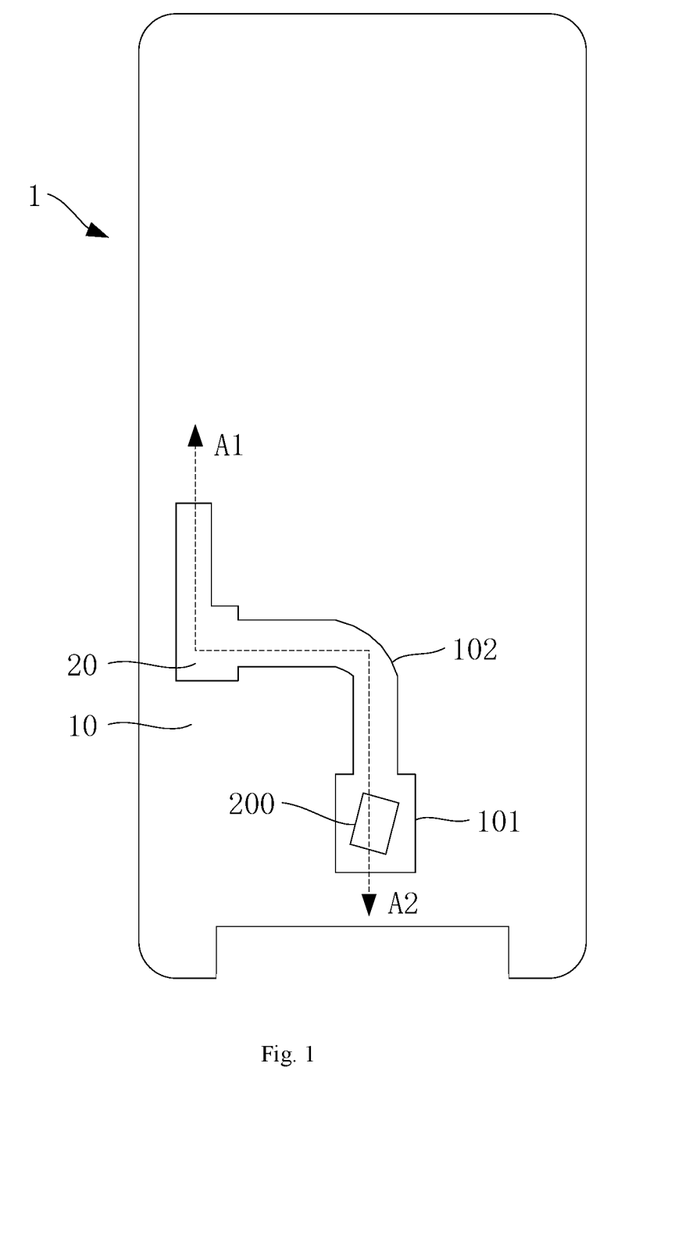
FIG. 1 is a structural schematic diagram of a heat dissipation module provided by an embodiment of the present application.

As shown in FIG. 1 and FIG. 3, in some embodiments, the hollowed-out area 200 of the light shielding buffer layer 20 is square, and an included angle is formed between each side of the hollowed-out area 200 and a respective one side of the first accommodating slot 101.

Exemplarily, the included angle between each side of the hollowed-out area 200 and the respective one side of the first accommodating slot 101 is greater than 0 and less than 90 degrees.

In some embodiments, both the hollowed-out area 200 and the first accommodating slot 101 are square, and an included angle which is greater than 0 and less than 90 degrees is formed between each side of the hollowed-out area 200 and the respective one side of the first accommodating slot 101. That is, any side of the hollowed-out area 200 is not parallel to any side of the first accommodating slot 101. In another word, the hollowed-out area 200 is inclined relative to the first accommodating slot 101. Since the fingerprint sensor 31 is in a square shape similar to the shape of the first accommodating slot 101, and is accommodated in the first accommodating slot 101, the hollowed-out area 200 is also inclined relative to the square fingerprint sensor 31. In some embodiments, photosensitive elements in the fingerprint sensor 31 are in a dot matrix distribution along two right-angled sides of the fingerprint sensor 31. That is, the photosensitive elements in the fingerprint sensor 31 are arranged in a transverse direction and a longitudinal direction separately, and the transverse arrangement direction and the longitudinal arrangement direction are respectively parallel to the two right-angled sides of the fingerprint sensor 31. Therefore, the arrangement directions of the photosensitive elements in the fingerprint sensor 31 are inclined relative to the hollowed-out area 200. That is, the arrangement directions of the photosensitive elements in the fingerprint sensor 31 are not parallel to the extending directions of all the sides of the hollowed-out area 200. As a light entrance of the fingerprint sensor 31, the hollowed-out area 200 is inclined relative to the fingerprint sensor 31, and the extending directions of all the sides of the hollowed-out area 200 are not inconsistent with the arrangement directions of the photosensitive elements in the fingerprint sensor 31, so that the problem of Moire patterns in fingerprint collection can be effectively avoided, and the fingerprint identification effect can be improved.

In some embodiments, the hollowed-out area 200 of the light shielding buffer layer 20 may not be square, either, and may be in other shapes, such as a circular shape, an elliptical shape or a trapezoid shape, which may be determined according to an actual requirement.

As shown in FIG. 2 and FIG. 4, in some embodiments, the light shielding buffer layer 20 includes a grid adhesive layer 21 and a foam layer 22, and the grid adhesive layer 21 is on a side of the foam layer 22 facing away from the heat dissipation base material layer 10.

In some embodiments, the grid adhesive layer 21 may play a role in light shielding to avoid light leakage from the back of the display module 4. Furthermore, the heat dissipation module 1 and the display module 4 can be adhered together by the grid adhesive layer 21. The foam layer 22 plays a role in buffering.

As shown in FIG. 2 and FIG. 4, in some embodiments, the heat dissipation base material layer 10 includes an adhesive layer (not shown in the figures), a polyimide film layer 11 and a metal film layer 12. The adhesive layer is on a side of the polyimide film layer 11 facing the light shielding buffer layer 20, and the metal film layer 12 is on a side of the polyimide film layer 11 facing away from the light shielding buffer layer 20.

In some embodiments, the polyimide film layer 11 has certain hardness and a supporting function, and can disperse an external force to guarantee the flatness of the metal film layer 12. The metal film layer 12 mainly achieves heat dissipation and grounding effects. Exemplarily, a material of the metal film layer 12 may be copper, for example, a copper foil. The adhesive layer is used for adhering the polyimide film layer 11 and the metal film layer 12 to the light shielding buffer layer 20 together.

Exemplarily, a composite tape in embodiments of the application includes the grid adhesive layer (EMBO) 21, the foam layer (FOAM) 22, the polyimide film layer (PI) 11 and the metal film layer 12 which are arranged in sequence. A thickness of the grid adhesive layer 21 is 0.035 mm to 0.045 mm, such as 0.04 mm; a thickness of the foam layer 22 is 0.09 mm to 0.11 mm, such as 0.1 mm; a thickness of the polyimide film layer 11 is 0.02 mm to 0.03 mm, such as 0.025 mm; and a thickness of the metal film layer 12 is 0.045 mm to 0.055 mm, such as 0.05 mm. In addition, adhesive layers may also be arranged between every two adjacent film layers to cause the film layers to be adhered together.

Figure 5:
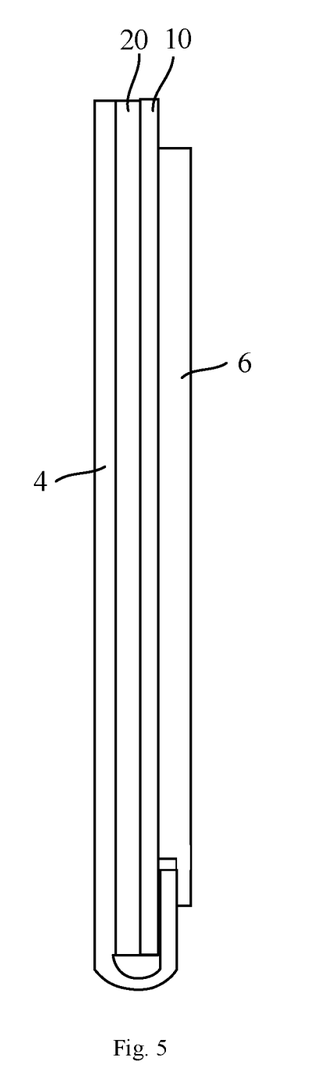
FIG. 5 is a structural schematic diagram of a cross section along a direction C1-C2 of the display assembly in FIG. 3.

As shown in FIG. 3 to FIG. 5, embodiments of the application further provide a display assembly 5. The display assembly 5 includes a display module 4, and the heat dissipation module 1 described in any one of the above-mentioned embodiments. The display module 4 is provided with a display area, and the display area is internally provided with a fingerprint identification area 40. The heat dissipation module 1 is located on a non-display side of the display module 4; and an orthographic projection of the hollowed-out area 200 of the light shielding buffer layer 20 on the display module 4 and the fingerprint identification area 40 at least partially overlap.

Exemplarily, the orthographic projection of the hollowed-out area 200 of the light shielding buffer layer 20 on the display module 4 and the fingerprint identification area 40 approximately overlap.

Exemplarily, the fingerprint identification area 40 is located within the orthographic projection of the hollowed-out area 200 of the light shielding buffer layer 20 on the display module 4. That is, the fingerprint identification area 40 of the display module 4 is smaller than the hollowed-out area 200 of the light shielding buffer layer 20 in area, thereby ensuring that fingerprint identification is performed in the fingerprint identification area 40, that is, fingerprint sensing can be effectively triggered.

As shown in FIG. 1 and FIG. 2, in some embodiments, the first accommodating slot 101 and the second accommodating slot 102 of the heat dissipation module 1 are open slots penetrating through the heat dissipation base material layer 10, and the first accommodating slot 101 communicates with the second accommodating slot 102.

As shown in FIG. 3 and FIG. 4, in some embodiments, the display assembly provided by the application further includes a fingerprint module. The fingerprint module includes a fingerprint sensor 31 and a flexible printed circuit 32. The fingerprint sensor 31 is located in the first accommodating slot 101 of the heat dissipation base material layer 10; the fingerprint sensor 31 covers the hollowed-out area 200 of the light shielding buffer layer 20, and the edge of the fingerprint sensor 31 is adhered to the light shielding buffer layer 20; the flexible printed circuit 32 is electrically connected to the fingerprint sensor 31; and the flexible printed circuit 32 is located in the second accommodating slot 102 of the heat dissipation base material layer 10 and adhered to the light shielding buffer layer 20.

As shown in FIG. 3, in some embodiments, a distance is reserved between the fingerprint sensor 31 and the edge of the first accommodating slot 101, and a distance is reserved between the flexible printed circuit 32 and the edge of the second accommodating slot 102. That is, the size of the first accommodating slot 101 is slightly greater than that of the fingerprint sensor 31, and the size of the second accommodating slot 102 is slightly greater than that of the flexible printed circuit 32, so that assembling of the fingerprint sensor 31 and the flexible printed circuit 32 can be facilitated.

As shown in FIG. 4, in some embodiments, a surface S1 of a side of the fingerprint sensor 31 facing away from the light shielding buffer layer 20 is closer to the light shielding buffer layer 20 relative to a surface S2 of a side of the heat dissipation base material layer 10 facing away from the light shielding buffer layer 20, or the surface S1 of the side of the fingerprint sensor 31 facing away from the light shielding buffer layer 20 and the surface S2 of the side of the heat dissipation base material layer 10 facing away from the light shielding buffer layer 20 are approximately flush with each other. A surface S3 of a side of the flexible printed circuit 32 facing away from the light shielding buffer layer 20 is closer to the light shielding buffer layer 20 relative to the surface S2 of the side of the heat dissipation base material layer 10 facing away from the light shielding buffer layer 20, or the surface S3 of the side of the flexible printed circuit 32 facing away from the light shielding buffer layer 20 and the surface S2 of the side of the heat dissipation base material layer 10 facing away from the light shielding buffer layer 20 are approximately flush with each other. In other words, the fingerprint sensor 31 and the flexible printed circuit 32 are accommodated in the accommodating slots without protruding from the accommodating slots, so that the thickness of the complete machine cannot be increased; and therefore, the difficulty of the assembling of the complete machine can be lowered to the maximum extent, and the thickness of the complete machine is reduced.

For example, for a display product such as a smart phone, the display assembly is generally assembled with a middle frame. That is, the middle frame of the complete machine is arranged at the sides of the heat dissipation module 1 and the fingerprint module facing away from the display module 4. The fingerprint sensor 31 and the flexible printed circuit 32 are completely accommodated in the accommodating slots of the heat dissipation module 1 or are flush with a surface of the heat dissipation module 1, so that the difficulty of assembling of the display assembly and the middle frame can be greatly lowered, and the thickness of the complete machine is reduced.

As shown in FIG. 3 and FIG. 5, in some embodiments, the display assembly provided by the application further includes a main flexible printed circuit (FPC) 6 located on the back of the heat dissipation module 1. In some embodiments, a binding portion of the display module 4 bends towards the back of the heat dissipation module 1, and is bound to the main flexible printed circuit (FPC) 6. The flexible printed circuit 32 avoids the main flexible printed circuit 6 so as not to overlap with the main flexible printed circuit 6.

Figure 6:
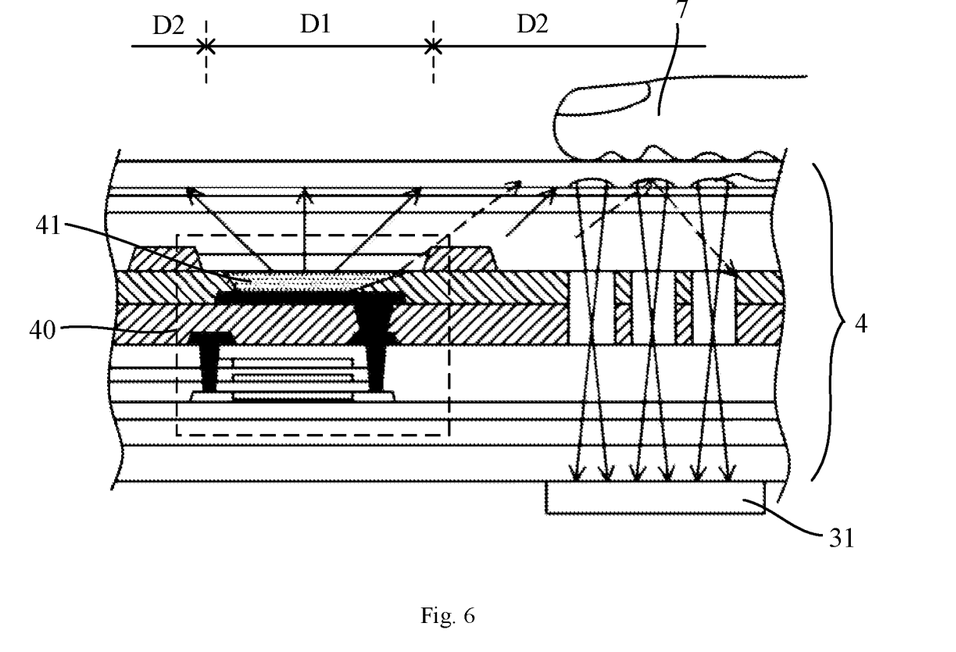
FIG. 6 is a partially sectional schematic diagram of an under-screen fingerprint identification structure in a display assembly provided by an embodiment of the present application.

As shown in FIG. 6, in some embodiments, the fingerprint identification area of the display module 4 has optical paths allowing light to pass through. Fingerprint information can reach the fingerprint sensor 31 via these optical paths.

In some embodiments, as shown in FIG. 6, the fingerprint identification area of the display module 4 includes a light-emitting area D1 provided with pixels 42 and a non light-emitting area D2 located between the pixels 42. The non light-emitting area D2 has optical paths allowing light to pass through. After being reflected by a finger 7, light emitted by light-emitting layers 41 in the pixels 42 can reach the fingerprint sensor 31 on the back of the display module 4 through the optical paths of the non light-emitting area D2, thereby realizing identification of the fingerprint information.

In addition, the application further provides a display device. The display device includes the display assembly described in any one of the above-mentioned embodiments.

In some embodiments, the display device may be a display device having a fingerprint identification function, such as a tablet PC and a mobile phone.

According to the display device provided by embodiments of the application, the fingerprint identification module is arranged in the accommodating slots of the heat dissipation module 1 without occupying the space of the complete machine of the display product or occupying a very small space, thus effectively reducing the thickness of the complete machine and lowering the difficulty of assembling of the complete machine.

Although the preferred embodiments of the application have been described, those skilled in the art can make other changes and modifications to these embodiments once they acquire the basic creative concept. Therefore, appended claims are intended to be explained as including the preferred embodiments and all the changes and modifications that fall within the scope of the application.

It is apparent that those skilled in the art can make various changes and variants to the embodiments of the application without departing from the spirits and scopes of the embodiments of the application. Therefore, if these modifications and variants of the embodiments of the application fall within the scope of the claims of the application and equivalent technologies thereof, the application is intended to include these changes and variants.

What is claimed is:

1. A heat dissipation module, comprising:
a heat dissipation base material layer, provided with a first accommodating slot for accommodating a fingerprint sensor and a second accommodating slot for accommodating a flexible printed circuit, the fingerprint sensor and the flexible printed circuit being electrically connected, and the first accommodating slot being an open slot penetrating through the heat dissipation base material layer; and
a light shielding buffer layer, on a side of the heat dissipation base material layer facing away from an opening of the second accommodating slot and provided with a hollowed-out area, an orthographic projection of the hollowed-out area on the heat dissipation base material layer being in the first accommodating slot, the hollowed-out area being configured to expose a photosensitive area of the fingerprint sensor, and an impedance of a surface of a side of the light shielding buffer layer facing away from the heat dissipation base material layer being $10^6\Omega$-$10^{10}\Omega$.

2. The heat dissipation module according to claim 1, wherein the flexible printed circuit is configured to carry a component for realizing a fingerprint identification function.

3. The heat dissipation module according to claim 1, wherein the second accommodating slot is an open slot penetrating through the heat dissipation base material layer.

4. The heat dissipation module according to claim 1, wherein the flexible printed circuit is provided with a component area; at least a part of the flexible printed circuit is in the second accommodating slot; and the at least part comprises the component area.

5. The heat dissipation module according to claim 1, wherein the fingerprint sensor is square, the flexible printed circuit is strip-shaped, and one end of the flexible printed circuit is connected to the fingerprint sensor;

the first accommodating slot is a square slot similar to the fingerprint sensor in shape; the second accommodating slot is a strip-shaped slot similar to the flexible printed circuit in shape, and one end of the second accommodating slot communicates with the first accommodating slot.

6. The heat dissipation module according to claim 5, wherein a distance between an edge of the fingerprint sensor and an edge of the first accommodating slot is 0.5 mm to 0.7 mm, and a distance between an edge of the flexible printed circuit and an edge of the second accommodating slot is 0.5 mm to 0.7 mm.

7. The heat dissipation module according to claim 5, wherein the hollowed-out area is square, and an included angle is formed between each side of the hollowed-out area and a respective one side of the square slot.

8. The heat dissipation module according to claim 7, wherein the included angle is greater than 0 and less than 90 degrees.

9. The heat dissipation module according to claim 1, wherein the light shielding buffer layer comprises a grid adhesive layer and a foam layer, and the grid adhesive layer is on a side of the foam layer facing away from the heat dissipation base material layer.

10. The heat dissipation module according to claim 9, wherein the heat dissipation base material layer comprises an adhesive layer, a polyimide film layer and a metal film layer; the adhesive layer is on a side of the polyimide film layer facing the light shielding buffer layer; and the metal film layer is on a side of the polyimide film layer facing away from the light shielding buffer layer.

11. The heat dissipation module according to claim 10, wherein a material of the metal film layer is copper.

12. The heat dissipation module according to claim 9, wherein a thickness of the grid adhesive layer is 0.035 mm to 0.045 mm; a thickness of the foam layer is 0.09 mm to 0.11 mm; a thickness of the polyimide film layer is 0.02 mm to 0.03 mm; and a thickness of the metal film layer is 0.045 mm to 0.055 mm.

13. The heat dissipation module according to claim 1, wherein depths of the first accommodating slot and the second accommodating slot are greater than or equal to 0.1 mm.

14. A display assembly, comprising a display module and a heat dissipation module; wherein:

the heat dissipation module comprises:

a heat dissipation base material layer, provided with a first accommodating slot for accommodating a fingerprint sensor and a second accommodating slot for accommodating a flexible printed circuit, the fingerprint sensor and the flexible printed circuit being electrically connected, and the first accommodating slot being an open slot penetrating through the heat dissipation base material layer; and a light shielding buffer layer, on a side of the heat dissipation base material layer facing away from an opening of the second accommodating slot and provided with a hollowed-out area, an orthographic projection of the hollowed-out area on the heat dissipation base material layer being in the first accommodating slot, the hollowed-out area being configured to expose a photosensitive area of the fingerprint sensor, and an impedance of a surface of a side of the light shielding buffer layer facing away from the heat dissipation base material layer being $106\Omega$-$1010\ \Omega$;

the display module is provided with a display area, and the display area includes a fingerprint identification area;

the heat dissipation module is on a non-display side of the display module; and an orthographic projection of the hollowed-out area of the light shielding buffer layer on the display module and the fingerprint identification area at least partially overlap.

15. The display assembly according to claim 14, wherein the fingerprint identification area is within the orthographic projection of the hollowed-out area of the light shielding buffer layer on the display module.

16. The display assembly according to claim 14, further comprising:

a fingerprint sensor, in the first accommodating slot of the heat dissipation base material layer, the fingerprint sensor covering the hollowed-out area of the light shielding buffer layer, and an edge of the fingerprint sensor being adhered to the light shielding buffer layer; and a flexible printed circuit, electrically connected to the fingerprint sensor, the flexible printed circuit being in the second accommodating slot of the heat dissipation base material layer and adhered to the light shielding buffer layer.

17. The display assembly according to claim 16, wherein a distance is reserved between the fingerprint sensor and an edge of the first accommodating slot, and a distance is reserved between the flexible printed circuit and an edge of the second accommodating slot.

18. The display assembly according to claim 16, wherein a surface of a side of the fingerprint sensor facing away from the light shielding buffer layer is closer to the light shielding buffer layer relative to a surface of a side of the heat dissipation base material layer facing away from the light shielding buffer layer, or the surface of the side of the fingerprint sensor facing away from the light shielding buffer layer and the surface of the side of the heat dissipation base material layer facing away from the light shielding buffer layer are approximately flush with each other;

a surface of a side of the flexible printed circuit facing away from the light shielding buffer layer is closer to the light shielding buffer layer relative to the surface of the side of the heat dissipation base material layer facing away from the light shielding buffer layer, or the surface of the side of the flexible printed circuit facing away from the light shielding buffer layer and the surface of the side of the heat dissipation base material layer facing away from the light shielding buffer layer are approximately flush with each other.

19. The display assembly according to claim 14, wherein the fingerprint identification area of the display module has an optical path allowing light to pass through.

20. A display device, comprising a display assembly, wherein the display assembly comprises a display module and a heat dissipation module, and wherein:

the heat dissipation module comprises:

a heat dissipation base material layer, provided with a first accommodating slot for accommodating a fingerprint sensor and a second accommodating slot for accommodating a flexible printed circuit, the fingerprint sensor and the flexible printed circuit being electrically connected, and the first accommodating slot being an open slot penetrating through the heat dissipation base material layer; and a light shielding buffer layer, on a side of the heat dissipation base material layer facing away from an opening of the second accommodating slot and provided with a hollowed-out area, an orthographic projection of the hollowed-out area on the heat dissipation base material layer being in the first accommodating slot, the hollowed-out area being configured to expose a photosensitive area of the fingerprint sensor, and an impedance of a surface of a side of the light shielding buffer layer facing away from the heat dissipation base material layer being 106Ω-1010 Ω;

the display module is provided with a display area, and the display area includes a fingerprint identification area;

the heat dissipation module is on a non-display side of the display module; and an orthographic projection of the hollowed-out area of the light shielding buffer layer on the display module and the fingerprint identification area at least partially overlap.

* * * * *